(12) United States Patent
Hidaka et al.

(10) Patent No.: US 8,791,442 B2
(45) Date of Patent: Jul. 29, 2014

(54) OPTICAL COUPLING DEVICE HAVING DUAL INVERTING AMPLIFIER AND A COMPARISON AMPLIFIED OUTPUT SIGNAL

(75) Inventors: Miki Hidaka, Fukuoka-ken (JP); Shigeyuki Sakura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 13/412,432

(22) Filed: Mar. 5, 2012

(65) Prior Publication Data

US 2013/0032698 A1 Feb. 7, 2013

(30) Foreign Application Priority Data

Aug. 5, 2011 (JP) ................ P2011-171801

(51) Int. Cl.
*G02B 27/00* (2006.01)
(52) U.S. Cl.
USPC .......................... 250/551; 250/214 R
(58) Field of Classification Search
USPC ....... 250/551, 214 R, 214.1, 214 A; 385/8, 9, 385/12; 327/514, 363, 427; 330/308, 59
See application file for complete search history.

(56) References Cited

U.S. PATENT DOCUMENTS

| | | | |
|---|---|---|---|
| 8,525,094 B2 * | 9/2013 | Maki | 250/214 A |
| 2004/0173729 A1 | 9/2004 | Shimizu et al. | |
| 2007/0145527 A1 | 6/2007 | Yamabi et al. | |

FOREIGN PATENT DOCUMENTS

| | | |
|---|---|---|
| JP | 2004274109 A | 9/2004 |
| JP | 3775574 | 3/2006 |
| JP | 2007180425 A | 7/2007 |

OTHER PUBLICATIONS

Japanese Office Action dated Mar. 7, 2014, filed in Japanese counterpart Application No. 2011-171801, 5 pages (with translation).

* cited by examiner

*Primary Examiner* — Que T Le
(74) *Attorney, Agent, or Firm* — Patterson & Sheridan, LLP

(57) ABSTRACT

According to one embodiment, an optical coupling device is provided.

A first photodiode receives an optical signal generated by a light emitting element and converts the optical signal into a first electrical signal. A first inverting amplifier is provided with a first feedback resistor and a first operating amplifier connected in parallel with each other. The input end is connected to a cathode of the first photodiode. A first signal which is obtained by inverting the first electrical signal is output from the output end. A second inverting amplifier is provided with a second feedback resistor and a second operating amplifier connected in parallel with each other. The input end of the second inverting amplifier is connected to a cathode of a second photodiode. The second inverting amplifier outputs a second signal from the output end. A comparator receives the first and second signals and outputs a comparison amplified signal.

13 Claims, 7 Drawing Sheets

US 8,791,442 B2

OPTICAL COUPLING DEVICE HAVING DUAL INVERTING AMPLIFIER AND A COMPARISON AMPLIFIED OUTPUT SIGNAL

CROSS-REFERENCE TO RELATED APPLICATION(S)

This application is based upon and claims the benefit of priority from the prior Japanese Patent Application No. 2011-171801, filed on Aug. 5, 2011, the entire contents of which are incorporated herein by reference.

FIELD

Embodiments described herein relate generally to an optical coupling device.

BACKGROUND

An optical coupling device such as a photocoupler is provided with a light emitting portion and a light receiving portion. The light emitting portion is provided on an input side and the light receiving portion is provided on an output side. An optical signal generated at the light emitting portion is received by the light receiving portion, and a signal converted into an electric signal is output from the light receiving portion. The light receiving portion is provided with an amplifier such as a differential amplifier and an inverting amplifier.

When a trans-impedance amplifier (TIA) which is an inverting amplifier is used as an amplifier of an optical coupling device, the device can be influenced by power source noise easily. In order to suppress the influence of power source noise, a dummy trans-impedance amplifier and a dummy photodiode are provided. A photodiode occupies relatively large area in a semiconductor chip which is provided in an optical coupling device. Accordingly, when a dummy photodiode is provided in an optical coupling device, it caused a problem that an occupation area of a semiconductor chip is difficult to be reduced.

DETAILED DESCRIPTION

Figure 1:
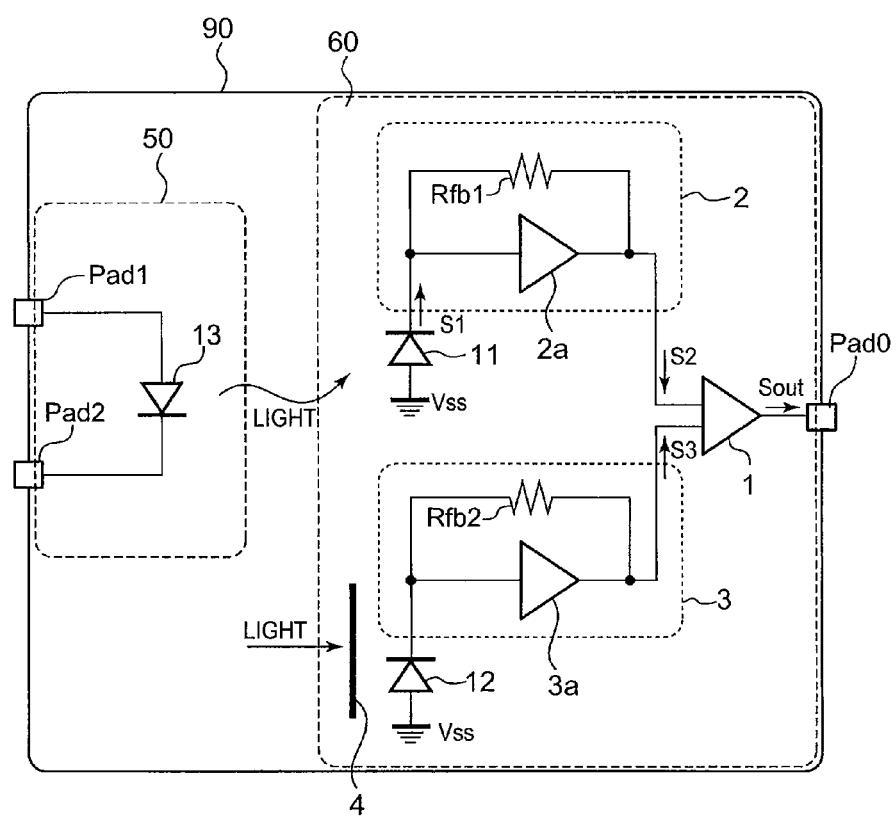
FIG. 1 is a circuit diagram illustrating a structure of an optical coupling device according to a first embodiment.

According to one embodiment, an optical coupling device is provided. The optical coupling device has a light emitting element, first and second photodiodes, first and second inverting amplifiers and a comparator.

The first photodiode has a cathode and an anode to be connected to a power source on a lower potential side. The first photodiode receives an optical signal generated by the light emitting element and converts the optical signal into a first electrical signal. The first inverting amplifier is provided with input and output ends, and a first feedback resistor and a first operating amplifier connected in parallel with each other. The input end is connected to the cathode of the first photodiode. The first inverting amplifier outputs a first signal obtained by inverting the first electrical signal, from the output end. The second photodiode has a cathode and an anode which is connected to the power source on a lower potential side. The second inverting amplifier is provided with input and output ends, and a second feedback resistor and a second operating amplifier connected in parallel with each other. The input end of the second inverting amplifier is connected to the cathode of the second photodiode. The second inverting amplifier outputs a second signal from the output end. The comparator receives the first and second signals and compares the first and second signals using the second signal as a reference voltage to output a comparison amplified signal. The product of a first junction capacitance of the first photodiode and a resistance of the first feedback resistor, and the product of a second junction capacitance of the second photodiode and a resistance of the second feedback resistor are set to be the same value substantially. The second junction capacitance is set to be smaller than the first junction capacitance.

Hereinafter, further embodiments will be described with reference to the drawings.

In the drawings, the same reference numerals denote the same or similar portions respectively.

An optical coupling device according to the first embodiment of the present invention will be described with reference to FIGS. 1 to 3.

Figure 2:
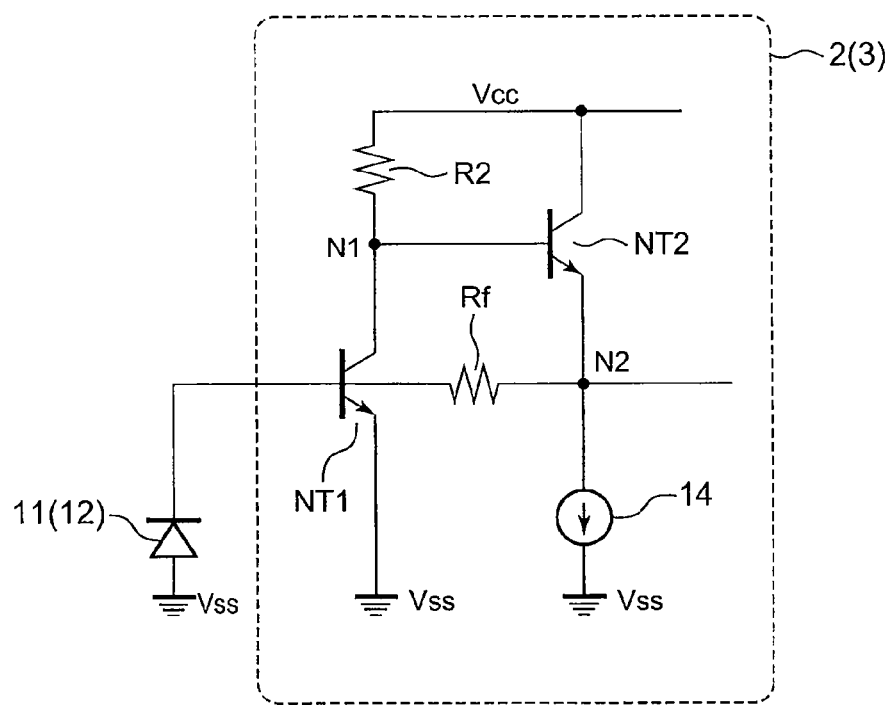
FIG. 2 is a circuit diagram illustrating a structure of a trans-impedance amplifier and a photodiode provided in the optical coupling device.

FIG. 1 is a circuit diagram illustrating a structure of the optical coupling device. FIG. 2 is a circuit diagram illustrating a structure of a trans-impedance amplifier. FIG. 3 is a diagram illustrating an equivalent circuit of the trans-impedance amplifier.

In the present embodiment, a semiconductor chip is reduced in size while maintaining the product of a junction capacitance of a photodiode and a resistance of a feedback resistor of a trans-impedance amplifier and the product of a junction capacitance of a dummy photodiode and a resistance of a feedback resistor of a dummy trans-impedance amplifier at the same values.

As illustrated in FIG. 1, an optical coupling device 90 is provided with a light emitting portion 50 on a primary side and a light receiving portion 60 on a secondary side. The optical coupling device 90 converts an input electrical signal into an optical signal at the light emitting portion 50 provided on the primary side and converts it into an electrical signal at the light receiving portion 60 provided on the secondary side. The optical coupling device 90 is a photocoupler. The present embodiment can be applied to an interrupter as another optical coupling device.

The light emitting portion 50 is provided with a light emitting diode (LED) 13, a terminal Pad1 and a terminal Pad2. The terminal Pad1 and the terminal Pad2 receive an electrical signal. The light emitting diode 13 converts the electrical signal into an optical signal.

The light receiving portion 60 is provided with a comparator 1, a trans-impedance amplifier (TIA) 2 as a first inverting amplifier, a dummy trans-impedance amplifier 3 as a second inverting amplifier, a photodiode 11 as a first photodiode, a dummy photodiode 12 as a second photodiode, and a terminal Pado. These elements are formed in a semiconductor as an integrated circuit.

An anode of the photodiode (PD) 11 is connected to a power source Vss of a ground potential on a lower potential side and a cathode of the photodiode (PD) 11 is connected to an input side of the trans-impedance amplifier 2. The photodiode 11 converts an optical signal generated by the light-emitting diode 13 into an electrical signal and outputs a signal S1 converted into the electrical signal.

The trans-impedance amplifier 2 is provided between the photodiode 11 and the comparator 1. In the trans-impedance amplifier 2, an operating amplifier 2a and a feedback resistor Rfb1 are arranged in parallel. One end of the feedback resistor Rfb1 is connected to the input side of the trans-impedance amplifier 2 and the other end of the feedback resistor Rfb1 is connected to an output side of the trans-impedance amplifier 2. The trans-impedance amplifier 2 receives the signal S1 and outputs an inversely amplified signal S2.

An anode of the dummy photodiode 12 is connected to the power source Vss of the ground potential on the lower potential side, and a cathode of the dummy photodiode 12 is connected to an input side of the dummy trans-impedance amplifier 3. The dummy photodiode 12 is light-shielded by an aluminum plate, for example.

A dummy trans-impedance amplifier 3 as the second inverting amplifier is provided between the dummy photodiode 12 and the comparator 1. In the dummy trans-impedance amplifier 3, an operating amplifier 3a and a feedback resistor Rfb2 are arranged in parallel. One end of the feedback resistor Rfb2 is connected to the input side of the dummy trans-impedance amplifier 3 and the other end of the feedback resistor Rfb2 is connected to an output side of the dummy trans-impedance amplifier 3. The dummy trans-impedance amplifier 3 generates a signal S3 which is used as a reference voltage of the comparator 1.

The trans-impedance amplifier 2 and the dummy trans-impedance amplifier 3 can be influenced by power noise easily. In order to avoid the influence of the power source noise, normally, the photodiode 11 provided at the light receiving portion 60 is formed so as to be the same size as the dummy photodiode 12 which is arranged for generating the reference voltage. In the present embodiment, the semiconductor chip composing the light receiving portion 60 is reduced in size as described below.

The comparator 1 is provided among the trans-impedance amplifier 2, the dummy trans-impedance amplifier 3 and the terminal Pado. The signal S2 and the signal S3 are input to the comparator 1. The comparator 1 performs comparison between the signal S2 and the signal S3 using the signal S3 as the reference voltage and outputs a comparison amplified signal as an output signal Sout via the terminal Pado.

The trans-impedance amplifier 2 and the dummy trans-impedance amplifier 3 have the same circuit structure. As illustrated in FIG. 2, the trans-impedance amplifier 2 and the dummy trans-impedance amplifier 3 are respectively provided with a current source 14, NPN transistors NT1, NT2, a resistor R2, and a feedback resistor Rf. The feedback resistor Rf corresponds respectively to the feedback resistor Rfb1 of the trans-impedance amplifier 2 and to the feedback resistor Rfb2 of the dummy trans-impedance amplifier 3.

A collector of the NPN transistor NT1 is connected to a node N1, a base of the transistor NT1 is connected to the cathode of the photodiode 11 or 12, and an emitter of the transistor NT1 is connected to the power source Vss of the ground potential on the lower potential side. One end of the resistor R2 is connected to a power source Vcc on a higher potential side and the other end is connected to the node N1. One end of the feedback resistor Rf is connected to the cathode of the photodiode and the base of the NPN transistor NT1 and the other end is connected to the node N2 on an output side.

A collector of the NPN transistor NT2 is connected to the power source Vcc on the higher potential side, a base of the transistor NT2 is connected to the node N1, and an emitter of the transistor NT2 is connected to the node N2. One end of the current source 14 is connected to the node N2 and the other end is connected to the power source Vss of the ground potential on the lower potential side. The current source 14 provides current to the power source Vss of the ground potential on the low potential side. In the present embodiment, a Si bipolar transistor or a SiGe bipolar transistor having desirable high-frequency characteristics is used as each NPN transistors NT1, NT2.

Figure 3:
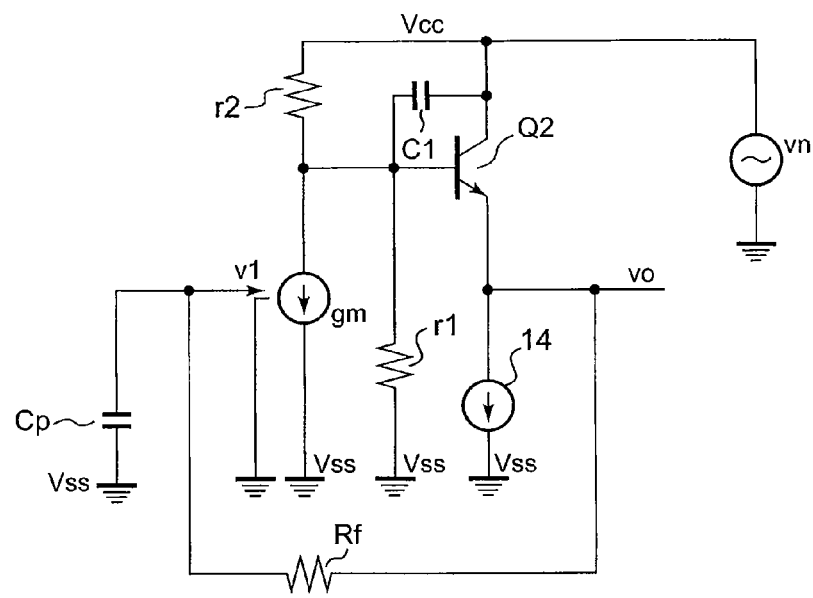
FIG. 3 is a diagram illustrating an equivalent circuit of the trans-impedance amplifier and the photodiode provided in the optical coupling device.

The trans-impedance amplifier 2 and the photodiode 11, or the dummy trans-impedance amplifier 3 and the photodiode 12 can be illustrated as an equivalent circuit in FIG. 3.

A junction capacitance Cp is indicated as a junction capacitance of the photodiode 11 or the dummy photodiode 12. The NPN transistor NT2 is expressed as an ideal transistor Q2. A parasitic capacitance C1 is indicated as a parasitic capacitance between a collector and a base of the ideal transistor Q2. An equivalent resistor r1 is indicated as an equivalent resistor due to an Early Effect which is caused in a case that the NPN transistor NT1 is an ideal transistor Q1 (not illustrated in FIG. 3). A load resistor r2 is indicated as the resistor R2. A conductance gm is indicated as a conductance of the ideal transistor Q1. One end of the feedback resistor Rf is connected to a circuit i.e. the junction capacitance Cp on an input side of a voltage v1 and the other end is connected to a circuit i.e. emitter of the transistor Q2 on an output side of a voltage vo. The trans-impedance amplifier 2 and the dummy trans-impedance amplifier 3 can be influenced by power noise easily. A noise voltage vn added to the power source Vcc on the higher potential side is illustrated to estimate the influence of the power source noise.

A parasitic capacitance between the collector and the base of the ideal transistor Q1 is assumed to be at a negligible level as it is sufficiently small. The equivalent resistor due to the Early Effect of the ideal transistor Q2 is connected in parallel to an output end of the trans-impedance amplifier with negative feedback. Accordingly, the resistor has low impedance and has a small influence to other circuits, and thus is omitted in FIG. 3.

Referring to the equivalent circuit of FIG. 3, a transfer function vo/vn of an output voltage against a noise voltage vn which is added to the power source Vcc on the higher potential side is acquired. The transfer function is expressed as a function of a complex frequency s. A power supply rejection ratio (PSRR) is expressed as the inverse vn/vo against the transfer function (vo/vn). The transfer function vo/vn is expressed as follows.

$$\frac{vo}{vn} = \frac{C_p C_1 R_f \times s^2 + \left(C_1 + \frac{C_p R_f}{r_2}\right) \times s + \frac{1}{r_2}}{C_p C_1 R_f \times s^2 + \left(C_1 + \frac{C_p R_f}{(r_1 // r_2)}\right) \times s + g_m + \frac{1}{(r_1 // r_2)}} \quad (1)$$

Response of the output voltage vo against the noise voltage vn is expressed by the above equation (1). The junction capacitance Cp of the photodiode 11 or the dummy photodiode 12, and the resistance of the feedback resistor Rf in the trans-impedance amplifier 2 or the dummy trans-impedance amplifier 3 are expressed as a pair in the equation (1). Accordingly, when the product of the junction capacitance Cp and the resistance of the feedback resistor Rf is the same, the response to a power source noise is the same.

Thus, the following equation can be satisfied.

$$Cp1 \times Rf1 = Cp2 \times Rf2 \qquad (2)$$

The junction capacitance of the photodiode 11 is denoted by Cp1 and the junction capacitance of the dummy photodiode 12 is denoted by Cp2. From the above equation (2), even if the relation among the resistance of the feedback resistor Rfb1 of the trans-impedance amplifier 2, the resistance of the feedback resistor Rfb2 of the dummy trans-impedance amplifier 3, the junction capacitance Cp1, and the junction capacitance Cp2 is set to satisfy "Cp1>Cp2" and "Rfb1<Rfb2", the response of the output voltage vo against the noise voltage vn is the same. As long as the response of the output voltage vo is the same, the comparator 1 does not respond to the noise voltage. Accordingly, it is possible to maintain noise-resistant characteristics.

In general, an occupation area of a photodiode is one or more digits larger than an occupation area of a resistor. Accordingly, when the occupation area of the dummy photodiode 12 is reduced while the relation of the above equation (2) is maintained, it is possible to reduce the sum of the occupation area of the dummy photodiode 12 and the occupation area of the feedback resistor Rfb2 of the dummy trans-impedance amplifier 3. In other words, it is possible to reduce the occupation area of a semiconductor chip in which the above elements are formed.

Figure 4:
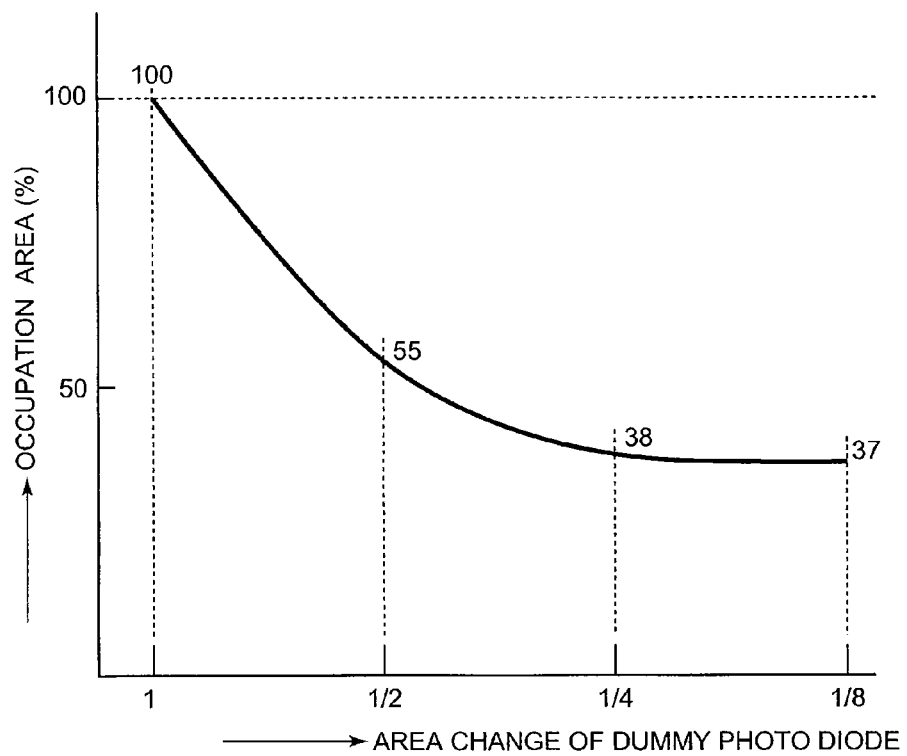
FIG. 4 is a graph indicating a variation of a sum of an occupation area of the dummy photodiode and an occupation area of a feedback resistor of a dummy trans-impedance amplifier, with respect to an area variation of the dummy photodiode provided in the optical coupling device.

Effects of reduction in occupation area are described below with reference to FIG. 4. FIG. 4 is a graph illustrating a variation of the sum of the occupation area of the dummy photodiode 12 and the occupation area of the feedback resistor Rfb2 of the dummy trans-impedance amplifier 3, with respect to a variation of the area of the dummy photodiode 12. The occupation area "100%" denotes the sum of the occupation area of the dummy photodiode 12 and the occupation area of the feedback resistor Rfb2 of the dummy trans-impedance amplifier 3 which is obtained in a case that the dummy photodiode 12 and the photodiode 11 are set to have the same occupation area.

As illustrated in FIG. 4, when the occupation area of the dummy photodiode 12 is reduced to be a half due to relatively small increase of the occupation area of the feedback resistor Rfb2 of the dummy trans-impedance amplifier 3, the sum of the occupation area of the dummy photodiode 12 and the occupation area of the feedback resistor Rfb2 of the dummy trans-impedance amplifier 3 becomes "55%". Accordingly, the occupation area can be reduced by 45%.

When the occupation area of the dummy photodiode 12 is reduced to be a quarter, the sum of the occupation area of the dummy photodiode 12 and the occupation area of the feedback resistor Rfb2 of the dummy trans-impedance amplifier 3 becomes "38%". Accordingly, the occupation area can be reduced by 62%.

When the occupation area of the dummy photodiode 12 is reduced to be one eighth, the sum of the occupation area of the dummy photodiode 12 and the occupation area of the feedback resistor Rfb2 of the dummy trans-impedance amplifier 3 becomes "37%". Accordingly, the occupation area can be reduced by 63%. The reduction effect in a case of reducing the occupation area to one eighth is relatively small compared to a case of reducing to a quarter.

As described above, in the optical coupling device of the present embodiment, the light receiving portion 60 which is a semiconductor chip is provided with the comparator 1, the trans-impedance amplifier 2, the dummy trans-impedance amplifier 3, the photodiode 11, the dummy photodiode 12, and the terminal Pado. The photodiode 11 and the dummy photodiode 12 occupy relatively large area in the optical coupling device 90. The product of the junction capacitance Cp1 of the photodiode 11 and the resistance of the feedback resistor Rfb1, and the product of the junction capacitance Cp2 of the dummy photodiode 12 and the resistance of the feedback resistor Rfb2 are set to be the same. Further, the occupation area of the junction capacitance Cp2 of the dummy photodiode 12 is reduced and the occupation area of the feedback resistor Rfb2 is increased.

Accordingly, it is possible to reduce the sum of the occupation area of the dummy photodiode 12 and the occupation area of the feedback resistor Rfb2 of the dummy trans-impedance amplifier 3 can be reduced. Accordingly, it is possible to reduce the occupation area of the semiconductor chip which is mounted on the optical coupling device 90.

Figure 5:
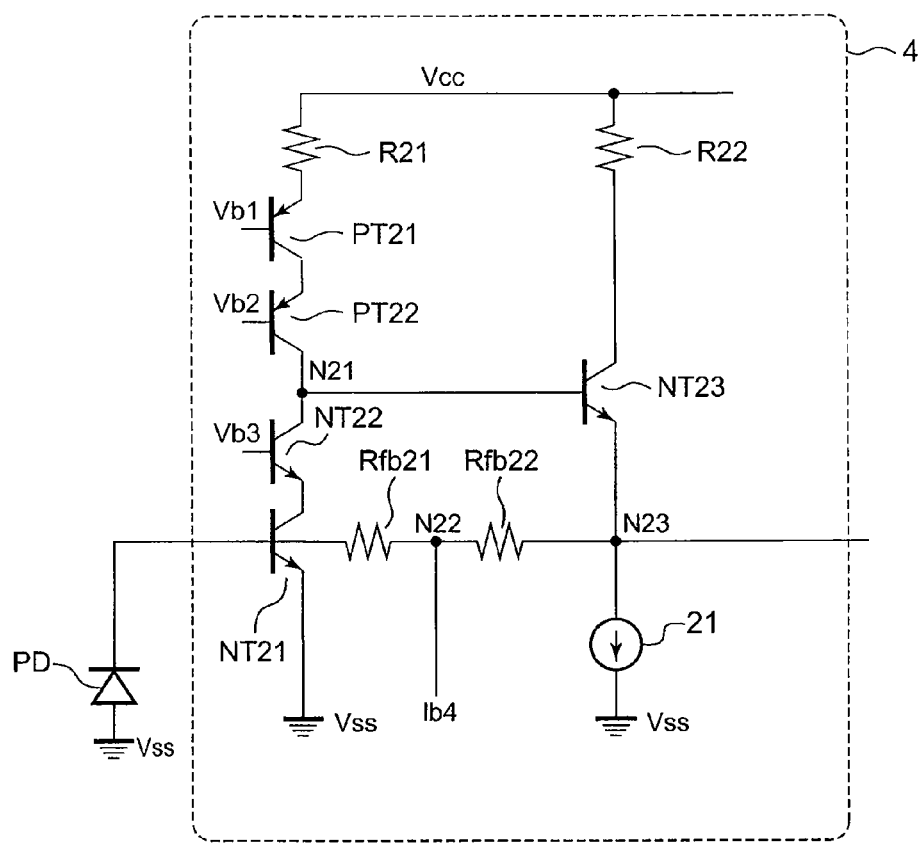
FIG. 5 is a circuit diagram illustrating a structure of a trans-impedance amplifier provided in a modified example.

The present embodiment uses the trans-impedance amplifier 2 having the feedback resistor Rfb1 and the dummy trans-impedance amplifier 3 having the feedback resistor Rfb2. It is also possible to arrange a plurality of feedback resistors in the trans-impedance amplifier 2 and the dummy trans-impedance amplifier 3, respectively. For example, for a trans-impedance amplifier 4 of a modified example illustrated in FIG. 5, it is possible to use a feedback resistors Rfb21, Rfb22 connected in series. The feedback resistors Rfb21, Rfb22 are provided between a cathode of a photodiode PD and a node N23 of an output side. A current Ib4 is supplied to a node N22 which connects the feedback resistors. In the trans-impedance amplifier 4, a resistor R21, a PNP transistor PT21, a PNP transistor PT22, an NPN transistor NT22, and an NPN transistor NT21 are cascade-connected between a power source Vcc on a higher potential side and a power source Vss of a ground potential on a lower potential side. Further, a resistor R22, an NPN transistor NT23, and a current source 21 are cascade-connected between the power source Vcc on the higher potential side and the power source Vss of the ground potential on the lower potential side.

In the present embodiment, the trans-impedance amplifier 2 is composed of bipolar transistors. It is also possible to constitute the trans-impedance amplifier 2 by a CMOS, a BiCMOS or a hetero-FET.

Figure 6:
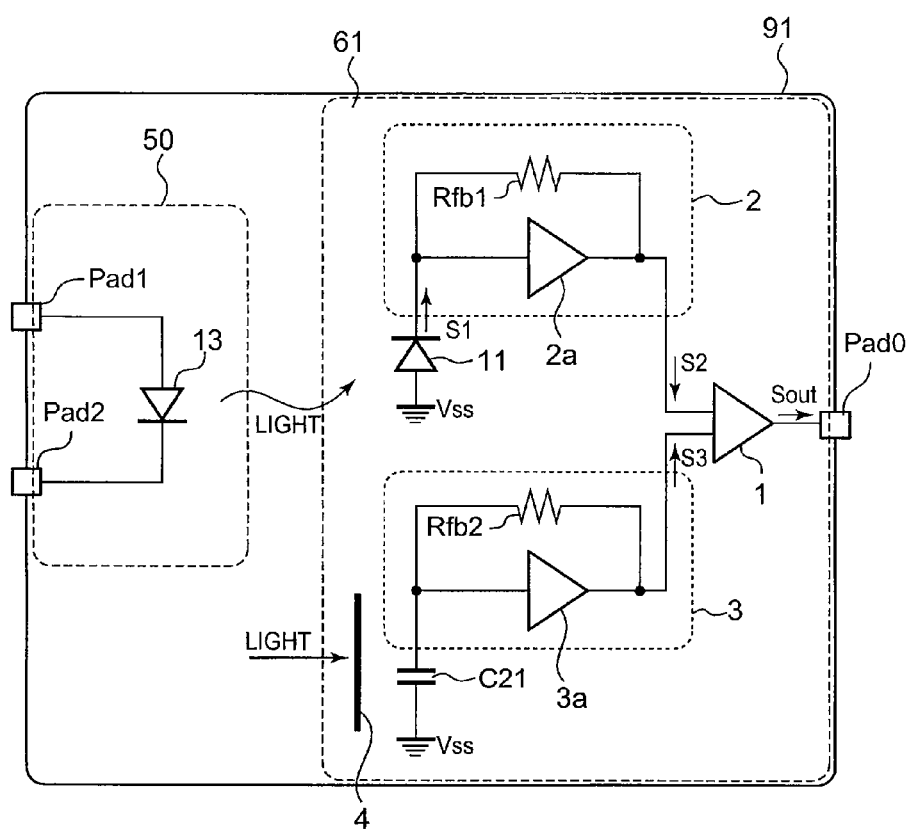
FIG. 6 is a circuit diagram illustrating a structure of an optical coupling device according to a second embodiment.

An optical coupling device according to a second embodiment will be described with reference to FIG. 6. FIG. 6 is a circuit diagram illustrating a structure of the optical coupling device. In the present embodiment, the dummy photodiode of the first embodiment is replaced with a MOS capacitor.

As illustrated in FIG. 6, an optical coupling device 91 is provided with a light emitting portion 50 on a primary side, and a light receiving portion 61 on a secondary side which is a semiconductor chip. The optical coupling device 91 once converts an input electrical signal into an optical signal at the light emitting portion 50 and converts it into an electrical signal at the light receiving portion 61.

The optical coupling device 91 of the present embodiment is a photocoupler. It is also possible to adopt an interrupter as another optical coupling device.

The light receiving portion 61 is provided with a comparator 1, a trans-impedance amplifier 2, a dummy trans-impedance amplifier 3, a photodiode 11, a capacitor C21, and a terminal Pado.

One end of the capacitor C21 is connected to a power source Vss of a ground potential on a low potential side and the other end is connected to an input side of the dummy trans-impedance amplifier 3. The capacitor C21 is light-shielded by an aluminum plate, for example. The capacitor C21 has a MOS-type structure. It is also possible to adopt a MIS-type structure. The MOS type denotes a structure obtained by laminating a silicon oxide ($SiO_2$) film of a relatively small thickness and an electrode film made of a metal or a high impurity concentration polysilicon on a silicon substrate. The MIS-type denotes a structure obtained by laminating an insulating film such as a SiN film having a relatively small thickness and having a relative permittivity larger than a silicon oxide ($SiO_2$) film, and an electrode film made of a metal or a high impurity concentration polysilicon on a silicon substrate. When the capacitor C21 having the MOS-type structure of the present embodiment is used instead of the dummy photodiode 12 of the first embodiment, the occupation area can be reduced to one thirtieth or less, for example.

Figure 7:
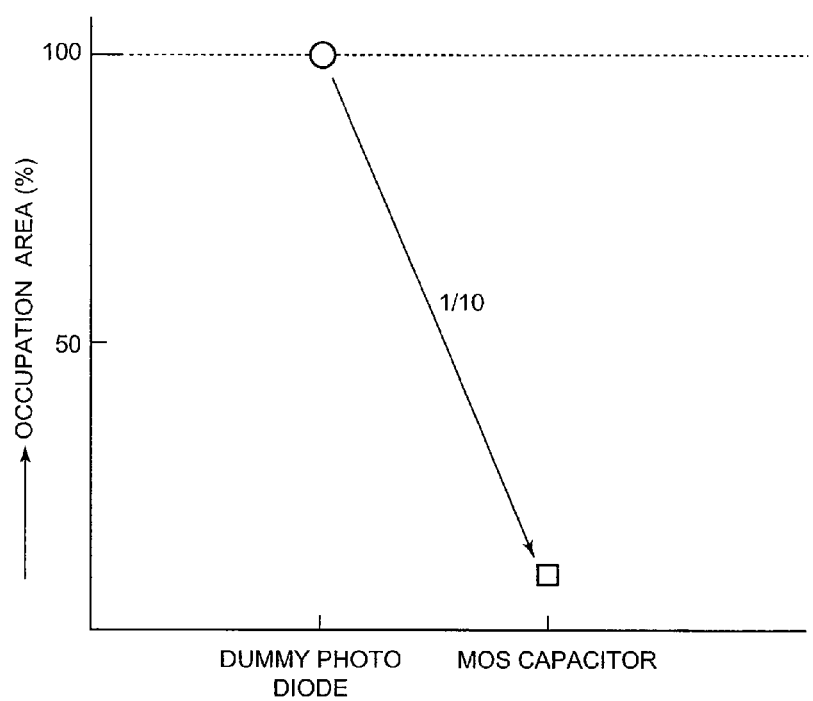
FIG. 7 is a graph indicating a variation of an in-chip occupation area when the dummy photodiode provided in the optical coupling device is replaced with a MOS capacitor according to the second embodiment.

Effects of reduction in occupation area of a semiconductor chip are described below with reference to FIG. 7. FIG. 7 is an explanatory graph of a variation of an occupation area when the dummy photodiode is replaced with the MOS capacitor.

As illustrated in FIG. 7, when the dummy photodiode 12 is replaced with the capacitor C21 having the MOS-type structure, the sum of the occupation area of the capacitor C21 and the occupation area of the feedback resistor Rfb2 of the dummy trans-impedance amplifier 3 becomes "9.7%", for example, compared with a case that the sum of the occupation area of the dummy photodiode 12 and the occupation area of the feedback resistor Rfb2 of the dummy trans-impedance amplifier 3 is "100%". Accordingly, it is possible to reduce by 90.3%.

As described above, in the optical coupling device of the present embodiment, the light receiving portion 61 is provided with the comparator 1, the trans-impedance amplifier 2, the dummy trans-impedance amplifier 3, the photodiode 11, the capacitor C21, and the terminal Pado. The product of the junction capacitance Cp1 of the photodiode 11 and the feedback resistor Rfb1 and the product of the capacitance of the capacitor C21 and the feedback resistor Rfb2 are set to be the same. Further, the capacitor C21 having the MOS-type structure has extremely small area compared with the dummy photodiode 12 of the first embodiment.

Accordingly, it is possible to remarkably reduce the sum of the occupation area of the capacitor C21 and the occupation area of the feedback resistor Rfb2 of the dummy trans-impedance amplifier 3. Accordingly, it is possible to reduce the occupation area of the semiconductor chip which is the light receiving portion 61 mounted on the optical coupling device 91.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical coupling device, comprising:
a light emitting element;
a first photodiode having a cathode and an anode to be connected to a power source on a lower potential side, the first photodiode receiving an optical signal generated by the light emitting element and converting the optical signal into a first electrical signal;
a first inverting amplifier which is provided with input and output ends, and a first feedback resistor and a first operating amplifier connected in parallel with each other, the input end being connected to the cathode of the first photodiode, the first inverting amplifier outputting a first signal obtained by inverting the first electrical signal, from the output end;
a second photodiode having a cathode and an anode which is connected to the power source on a lower potential side;
a second inverting amplifier which is provided with input and output ends, and a second feedback resistor and a second operating amplifier connected in parallel with each other, the input end of the second inverting amplifier being connected to the cathode of the second photodiode, the second inverting amplifier outputting a second signal from the output end; and
a comparator which receives the first and second signals and compares the first and second signals using the second signal as a reference voltage to output a comparison amplified signal,
wherein the product of a first junction capacitance of the first photodiode and a resistance of the first feedback resistor, and the product of a second junction capacitance of the second photodiode and a resistance of the second feedback resistor are set to be the same value substantially, and the second junction capacitance is set to be smaller than the first junction capacitance.

2. The device according to claim 1, further comprising a light-shielding plate which is capable of shielding light radiated toward the second photodiode.

3. The device according to claim 1, wherein at least one of the first and second feedback resistors is composed of a plurality of resistors which are connected in series.

4. The device according to claim 1, wherein the second photodiode is a dummy photodiode.

5. The device according to claim 1, wherein at least the first and second photodiodes and the first and second inverting amplifiers are formed in a same semiconductor chip.

6. The device according to claim 1, wherein at least one of the first and second inverting amplifiers is composed of a bipolar transistor, a CMOS, a BiCMOS or a HFET.

7. An optical coupling device, comprising:
a light emitting element;
a photodiode having a cathode and an anode to be connected to a power source, the photodiode receiving an optical signal generated by the light emitting element and converting the optical signal into a first electrical signal;
a first inverting amplifier which is provided with input and output ends, a first feedback resistor and a first operating amplifier connected in parallel with each other, the input end being connected to the cathode of the first photodiode, the first operating amplifier outputting a first signal obtained by inverting the first electrical signal, from the output end;
a capacitor having a first end, and a second end to be connected to the power source;
a second inverting amplifier which is provided with input and output ends, and a second feedback resistor and a second operating amplifier connected in parallel with each other, the input end of the second inverting amplifier being connected to the second end of the capacitor, the second inverting amplifier outputting a second signal from the output end; and a comparator which receives the first and second signals and compares the first and second signals using the second signal as a reference voltage to output a comparison amplified signal, wherein the product of a junction capacitance of the photodiode and a resistance of the first feedback resistor, and the product of the capacitance of the capacitor and a resistance of the second feedback resistor are set to be the same value substantially.

8. The device according to claim 7, further comprising a light-shielding plate which is capable of shielding light radiated toward the second photodiode.

9. The device according to claim 7, wherein the capacitor has a MOS structure or a MIS structure.

10. The device according to claim 7, wherein at least one of the first and second feedback resistors is composed of a plurality of resistors which are connected in series.

11. The device according to claim 7, wherein the capacitance of the capacitor is set to be smaller than the junction capacitance of the photodiode.

12. The device according to claim 7, wherein at least the photodiode, the capacitor and the first and second inverting amplifiers are formed in a same semiconductor chip.

13. The device according to claim 7, wherein at least one of the first and second inverting amplifiers is composed of a bipolar transistor, a CMOS, a BiCMOS or a HFET.

* * * * *